(12) United States Patent
Banin et al.

(10) Patent No.: US 11,608,394 B2
(45) Date of Patent: Mar. 21, 2023

(54) NANOPARTICLES AND FORMULATIONS FOR PRINTING

(71) Applicant: Yissum Research Development Company of the Hebrew University of Jerusalem Ltd., Jerusalem (IL)

(72) Inventors: Uri Banin, Mevasseret Zion (IL); Shlomo Magdassi, Jerusalem (IL); Nir Waiskopf, Jerusalem (IL); Lior Efraim Verbitsky, Jerusalem (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 24 days.

(21) Appl. No.: 16/967,645

(22) PCT Filed: Feb. 6, 2019

(86) PCT No.: PCT/IL2019/050145
§ 371 (c)(1),
(2) Date: Aug. 5, 2020

(87) PCT Pub. No.: WO2019/155463
PCT Pub. Date: Aug. 15, 2019

(65) Prior Publication Data
US 2021/0087302 A1    Mar. 25, 2021

Related U.S. Application Data

(60) Provisional application No. 62/626,812, filed on Feb. 6, 2018.

(51) Int. Cl.
| | | |
|---|---|---|
| *C08F 2/46* | (2006.01) |
| *C08F 2/50* | (2006.01) |
| *C08G 61/04* | (2006.01) |
| *B33Y 70/00* | (2020.01) |
| *C08F 20/28* | (2006.01) |
| *C09D 11/03* | (2014.01) |
| *C09D 11/101* | (2014.01) |
| *H01L 29/06* | (2006.01) |
| *B33Y 10/00* | (2015.01) |
| *B82Y 20/00* | (2011.01) |
| *B82Y 40/00* | (2011.01) |

(52) U.S. Cl.
CPC ............ *C08F 2/50* (2013.01); *B33Y 70/00* (2014.12); *C08F 20/28* (2013.01); *C09D 11/03* (2013.01); *C09D 11/101* (2013.01); *H01L 29/0665* (2013.01); *B33Y 10/00* (2014.12); *B82Y 20/00* (2013.01); *B82Y 40/00* (2013.01)

(58) Field of Classification Search
CPC ...... G03F 7/029; G03F 7/2053; G03F 7/0037; B33Y 70/00; B33Y 40/00; B33Y 10/00; B33Y 20/00; C09D 11/101; C09D 11/03; H01L 29/0665; C08F 2/50; C08F 20/28
USPC .......... 522/55, 49, 6, 1, 189, 184, 71; 520/1
See application file for complete search history.

(56) References Cited

U.S. PATENT DOCUMENTS

2004/0067433 A1 * 4/2004 Nirmal ............... B33Y 40/00
430/281.1

FOREIGN PATENT DOCUMENTS

WO    WO-2017002115 A2 *  1/2017  ........... A61K 6/0008

OTHER PUBLICATIONS

Dadashi-Silab et al, Semiconductor Nanoparticles for Photoinitiation of Free Radical Polymerization in Aqueous and Organic Media, Mar. 21, 2014, Journal of Polymer Science, Part A: Polymer Chemistry, 52, 1500-1507 (Year: 2014).*

Pawar et al, Rapid Three-Dimensional printing in Water Using Semiconductor-Metal Hybrid Nanoparticles as Photoinitiators, Jun. 15, 2017, Nano Lett., 17, 4497-4501 (Year: 2017).*

* cited by examiner

*Primary Examiner* — Jessica Whiteley
(74) *Attorney, Agent, or Firm* — Vorys, Sater, Seymour and Pease LLP; Anthony P. Venturino

(57) ABSTRACT

A method for generating reactive species in a medium in which light irradiates the medium including a nanoparticle. A photoinitiator composed of semiconductor nanoparticles for photo-polymerization and 2D and 3D printing.

14 Claims, 4 Drawing Sheets

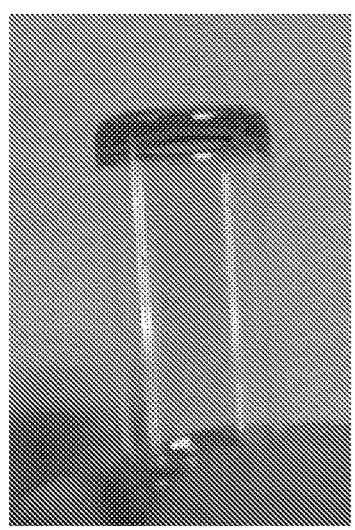
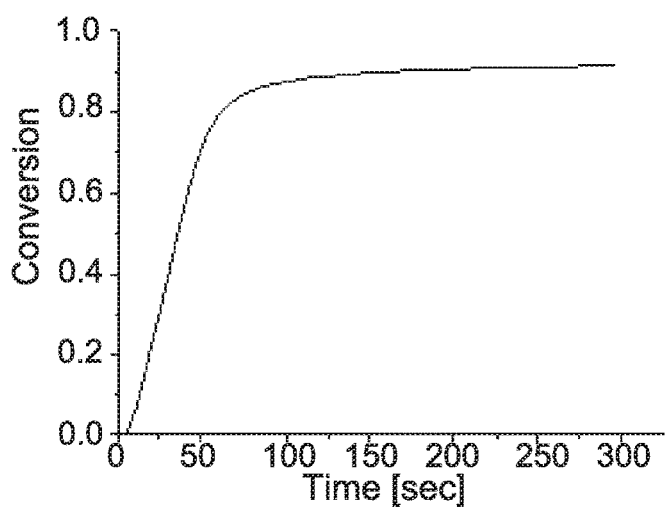
Fig. 3A  Fig. 3B
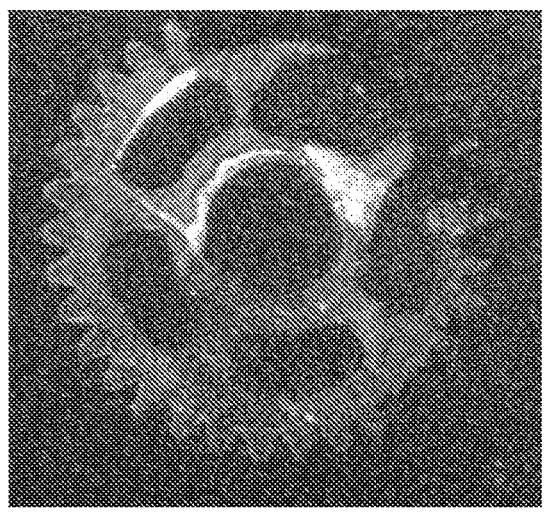
Fig. 3C
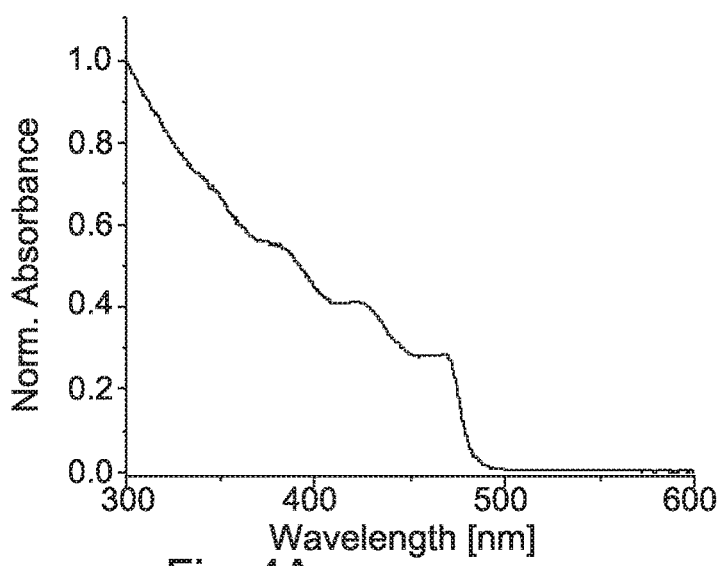
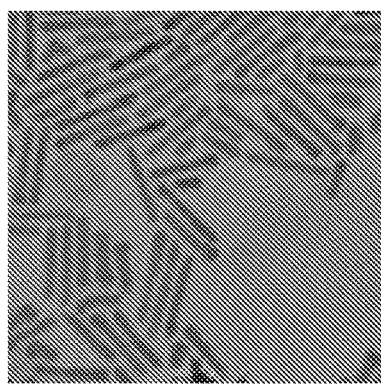
Fig. 4A  Fig. 4B

NANOPARTICLES AND FORMULATIONS FOR PRINTING

TECHNOLOGICAL FIELD

The invention disclosed herein generally concerns photoinitiator composed of nanoparticles coated by inorganic or organic ligands for photo-polymerization and 2D and 3D printing, and compositions containing the nanoparticles.

BACKGROUND

Additive manufacturing processes enable fabrication of complex and functional surfaces and 2D and 3D objects ranging from engine parts to artificial organs. Photo-polymerization, which is the most versatile technology enabling curing of advanced coatings (wood/automotive), adhesives and printing inks for 2D and 3D printing, utilizes photoinitiators that form radicals.

In such processes a photoinitiator (PI) may be used to absorb light and generate reactive species that initiate the polymerization reaction. The PI plays a crucial role in determining the rate of photo-initiation, the most critical step in a photo-polymerization processes, which determines the kinetics and properties of the resulting polymerized objects. Photo-initiation is directly proportional to the incident light intensity, the concentration of the photoinitiator and to certain intrinsic properties of the photoinitiator. The intrinsic properties of the photoinitiator that influence its utility are the optical density (O.D), quantum yield or cleavage events that occurs per photon absorbed and the photoinitiator efficiency or the ratio of initiation events to radicals generated by photolysis. For efficient polymerization, the initiator should have a large optical density and a good overlapping absorbance spectrum with the optical spectrum of the light sources.

Currently available photoinitiators undergo chemical cleavage upon irradiation to generate short-lived radicals which are consumed during the process. Thus, to perform a good photo-polymerization process, high concentrations of photoinitiators are often required. The poor water-solubility of most photoinitiators, along with retardation by dissolved oxygen, limits their use in aqueous systems with photocurable monomers.

Semiconductor nanocrystals (SCNCs) have profound advantages over organic molecules in terms of wavelength tunability and photochemical stability. Moreover, they exhibit few orders of magnitude larger one- and two-photon absorption cross sections resulting in very high light sensitivity.

These advantages have been utilized in the superior performance of SCNCs over fluorescent organic dyes in imaging and sensing applications and in their use in displays. In these applications, the excitation of the semiconductor generates an electron-hole pair (exciton) which can recombine while emitting a photon (radiative recombination). Significant enhancement of this relaxation pathway is achieved by synthesis of nanoparticles with two or more semiconducting materials, known as heterostructures. For example, localization of both electron and holes in the same semiconducting material and electronic passivation from surface defects and the outside environment (e.g. in core/shell structures) were found to increase the probability for radiative recombination leading to very high fluorescent quantum yield.

Nanocrystals have been reported to generate reactive species in presence of water and molecular oxygen, upon light-excitation [1]. This process utilizes a competitive relaxation route in which one or both charge carriers are transferred to molecular species in solution. This led researchers to attempt homogeneous semiconductor nanoparticles (composed of one semiconducting material) as PIs for photo-polymerization. However, poor initiation capacities were observed, requiring additives, purging of inert gas, high intensity UV lamps and irradiation for prolonged duration, limiting or unsuitable for photo-polymerization and 3D printing [2-7]. These results were attributed to a limited charge-separation of the light-induced charge carriers and fast competing relaxation pathways such as radiative recombination. The discouraging results, together with the notion that heterostructures may strengthen the competitive radiative pathway, and thus may even further emphasize the unsuitability of these systems in photoinitiation-based processes, have strengthened the disadvantages associated with the idea to use semiconductor heterostructures for photo-polymerization.

Using hybrid semiconductor-metal nanoparticles enables the process of light induced charge separation at the semiconductor-metal interface and opens the path for ensuing photocatalytic functionality. Such particles, with organic ligands on their surface, were demonstrated as efficient PIs for 2D and 3D printing, as well as in coatings. Their function is a photocatalytic mechanism where each particle can generate multiple radicals for the photopolymerization process. Their ability to also consume oxygen, a known retardant of photolymerization, has led to their utility also as PIs in water based photopolymerization processes [8]. However, envisioning that heterostructure nanoparticles composed only of semiconductors would be beneficial as PIs has not been addressed.

In a different but complementary aspect, the nanocrystals' surface coating was also found to have a significant effect on fluorescence and charge transfer capacity [9-11]. Colloidal nanocrystals are synthesized with organic ligands that allow controlling their syntheses and provide colloidal stability. The organic surface coating can then be replaced by a different one, for example by ligand exchange or polymer encapsulation, to provide good solubility in the working solution [10]. Recently, inorganic ligands that can replace the insulating organic surface coating were introduced for providing better electrical coupling between nanocrystals and metallic electrodes and in nanocrystal arrays for applications in electronic devices [11]. These require minimal leakage of charge carriers to molecules in the solution, suggesting low capacity to produce reactive agents by reaction with molecular species. In addition, simple stripping off of the original organic ligands was found to form surface traps. These are known to eliminate the semiconductor fluorescence and to affect their photocatalytic activities by strengthening a non-radiative route for the exciton relaxation [10, 12-13]. In some cases the addition of organic ligands to inactive particles suffering from surface defects was able to restore their catalytic activity [14].

REFERENCES

[1] Ipe, B. I., Lehnig, M. & Niemeyer, C. M. On the generation of free radical species from quantum dots. *Small* 1, 706-9 (2005).

[2] Zhang, D., Yang, J., Bao, S., Wu, Q. & Wang, Q. Semiconductor nanoparticle-based hydrogels prepared via self-initiated polymerization under sunlight, even visible light. *Sci. Rep.* 3, 1399 (2013).

[3] Liu, X., Ni, X., Wang, J. & Yu, X. A novel route to photoluminescent, water-soluble Mn-doped ZnS quantum dots via photopolymerization initiated by the quantum dots. *Nanotechnology* 19, 485602 (2008).

[4] Stroyuk, A. L., Granchak, V. M., Korzhak, A. V. & Kuchmii, S. Y. Photoinitiation of buthylmethacrylate polymerization by colloidal semiconductor nanoparticles. *J. Photochem. Photobiol. A Chem.* 162, 339-351 (2004).

[5] Stroyuk, A. L., Sobran, I. V. & Kuchmiy, S. Y. Photoinitiation of acrylamide polymerization by Fe2O3 nanoparticles. *J. Photochem. Photobiol. A Chem.* 192, 98-104 (2007).

[6] Dadashi-Silab, S., Asiri, A. M., Khan, S. B., Alamry, K. A. & Yagci, Y. Semiconductor nanoparticles for photoinitiation of free radical polymerization in aqueous and organic media. *J. Polym. Sci. Part A Polym. Chem.* 52, 1500-1507 (2014).

[7] Stroyuk, A. L., Sobran, I. V., Korzhak, A. V., Raevskaya, A. E. & Kuchmiy, S. Y. Photopolymerization of water-soluble acrylic monomers induced by colloidal CdS and CdxZn1-xS nanoparticles. *Colloid and Polymer Science* 286, 489-498 (2008).

[8] WO2017002115.

[9] Smith, A. M., Duan, H., Rhyner, M. N., Ruan, G. & Nie, S. A systematic examination of surface coatings on the optical and chemical properties of semiconductor quantum dots. *Phys. Chem. Chem. Phys.* 8, 3895 (2006).

[10] Ben-Shahar, Y. et al. Effect of surface coating on the photocatalytic function of hybrid CdS—Au nanorods. *Small* 11, 462-471 (2015).

[11] Boles, M. A., Ling, D., Hyeon, T. & Talapin, D. V. The surface science of nanocrystals. *Nat. Mater.* 15, 141-153 (2016).

[12] Pu, C. & Peng, X. To Battle Surface Traps on CdSe/CdS Core/Shell Nanocrystals: Shell Isolation versus Surface Treatment. *J. Am. Chem. Soc.* 138, 8134-8142 (2016).

[13] Houtepen, A. J., Hens, Z., Owen, J. S. & Infante, I. On the Origin of Surface Traps in Colloidal II-VI Semiconductor Nanocrystals. *Chem. Mater.* 29, 752-761 (2017).

[14] Marino, E. et al. Repairing Nanoparticle Surface Defects. *Angew. Chemie Int. Ed.* 56, 13795-13799 (2017).

SUMMARY OF THE INVENTION

Hence, the capacity to utilize of semiconductor nanocrystals and inorganic coatings, as well as certain heterostructures, as photoinitiators for photo-polymerization and 2D and 3D printing is not at all straightforward. Against the teachings of the art, the inventors of the technology disclosed herein have surprisingly found that certain classes of nanoparticles, e.g., semiconductor nanocrystals, having on their surfaces inorganic ligands, provide a unique class of novel photoinitiators (PIs), which their mere suitability as PIs and exceptional function in photo-polymerization and 2D and 3D printing are both surprising and unexpected.

The classes of nanoparticles used as PIs according to the invention are one or more of the following:
1. Nanoparticles surface-associated with inorganic ligands, optionally being free of organic ligands;
2. Semiconductor nanocrystal heterostructures surface-associated with inorganic ligands, optionally being free of organic ligands;
3. Semiconductor nanocrystal heterostructures surface-associated with organic ligands;
4. Type-1 semiconductor nanocrystal heterostructures surface-associated with inorganic ligands, optionally being free of organic ligands;
5. Type-1 semiconductor nanocrystal heterostructures surface-associated with organic ligands; and
6. Semiconductor-metal hybrid nanoparticles surface-associated with inorganic ligands, optionally being free of organic ligands.

The above classes of nanoparticles are referred to herein as "photoinitiator nanoparticles" (PIN).

In some embodiments, the PIN is not a semiconductor-metal hybrid nanoparticle. In some embodiments, the PIN is not a semiconductor-metal hybrid nanoparticle surface-associated with organic ligands.

The invention disclosed herein introduces the use of any of the above 6 classes of nanoparticles as photoinitiators for radical polymerization, which could be used in different applications including in photocuring of surface coatings or adhesives, in 2D and 3D printing and in single- and two-photon polymerization applications.

The inventors have demonstrated that these PINs can be used as photoinitiators while fulfilling other unmet needs due to their large single- and two-photon absorption cross-sections in the near UV-visible spectral range, which can be used for photo-polymerization using various excitation wavelengths by proper tailoring the nanoparticles structure and composition. Furthermore, these PINs can have multi-functional activities which open the opportunity for developing an efficient catalytic multi-functional photoinitiator system that offers several functional and economical productivity advantages. One such example is the "dual-action" of semiconductor nanocrystals in water, consuming molecular oxygen which is a known inhibitor of polymerization, while generating reactive oxygen species, which initiate the polymerization.

Thus, in a first aspect, the invention provides a nanoparticle (PIN, as defined herein) for use in generating reactive species, such as radicals, in solution (in the presence or absence of a liquid carrier or a solvent), the process comprising light irradiating a medium comprising said PIN, and, in some embodiments, also at least one material susceptible to photocatalytic conversion, to generate free radicals. The reactivity of the PIN is not limited in any way to one particular set of conditions, but rather finds utility and usefulness in a variety of, inter alia, temperatures, pressures, concentrations, solvents, light intensities, duration of exposure, matrix, etc.

In some embodiments, the PIN is a nanoparticle that is surface-associated with a plurality of inorganic ligands.

In some embodiments, the PIN is a semiconductor heterostructure that is surface-associated with a plurality of inorganic ligands.

In some embodiments, the PIN is a Type-1 semiconductor heterostructures that is surface associated with inorganic ligands.

In some embodiments, the PIN is a Type-2 semiconductor heterostructure that is surface associated with inorganic ligands.

In some embodiments, the PIN is a quasi-Type-2 semiconductor heterostructure that is surface associated with inorganic ligands. In some embodiments, the PIN is composed of semiconductor-metal hybrid nanoparticles that is surface associated with inorganic ligands.

In other words, the invention, in some of its embodiments, provides use of nanoparticles as photoinitiators, wherein the nanoparticles are surface associated with inorganic ligands, the nanoparticles being selected from homostructures, heterostructures, doped nanoparticles, Type-1 nanoparticles, Type-2 nanoparticles, quasi Type-2 nanoparticles and hybrid nanoparticles.

Where the nanoparticles are heterostructures or Type-1 nanoparticles or hybrid nanoparticles, each as disclosed herein, the ligand molecules present on their surface may be selected from organic ligands and inorganic ligands. In some embodiments, the ligands are inorganic ligands. In some embodiments, the ligands are organic ligands.

As stated herein, "nanoparticles" or "PIN" utilized in accordance with the invention, may be any nanoparticle, comprising a single material or a combination of materials, of any shape and size, provided that at least one size dimension, e.g., diameter, length, width, thickness, is at the nanoscale. The material(s) from which the PINs are made from is at least one material having photo-initiating capabilities, as defined. As used herein, and unless otherwise specified, a nanoparticle is a semiconductor nanoparticle or PIN according to the invention.

In some embodiments, the material is a single material or a combination of two or more materials. In some embodiments, the PIN is a homostructure, namely comprising a single material, e.g., a single semiconductor material, or a heterostructures comprising two or more different materials, e.g., two or more different semiconductor materials, or combination thereof. Where the PIN is a heterostructure, the different materials may be arranged in core/shell structures, core/multishell structures, or in any sectioned fashion, such that each material occupies a different region(s) of the nanoparticle.

In some embodiments, the PIN is of at least one intrinsic semiconductor material or of at least one extrinsic semiconductor material (n-type or p-type).

Where the PINs are heterostructures, they may be of materials selected from semiconductor materials, e.g., Type-1, reverse Type-1, Type-2, quasi-Type-2 materials.

As known in the art, in Type-1 nanoparticles the band gap of a semiconductor constructing the core is embedded within that constructing the shell. Thus, upon excitation, both excited charge carriers (electrons and holes) occupy the lowest electronic states which reside in the core. In reverse Type-1 nanoparticles, the band gap of the semiconductor constructing the shell is embedded within the band gap of the second semiconductor constructing the core. Thus, upon excitation, both excited charge carriers (electrons and holes) occupy the lowest electronic states which reside in the shell.

In Type-2 nanoparticles, the band-gaps of the two semiconductors are staggered with respect to each other. Upon excitation of the nanoparticle, the staggered band structure leads to a spatial separation of the excited holes and electrons to different regions of the core/shell structure.

In the intermediate case, quasi-Type-2, the valence or the conduction band-edge of the core and shell are nearly aligned, leading to a partial charge separation, where one of the charge carriers is confined to either the core or the shell, while the other occupies the entire nanoparticle.

The PIN may thus be of any shape and composition. The PINs may be selected from spherical, dot-shaped, rod-shaped, wire, cubic, cylindrical, whisker-like, platelet, multipod, frame, and/or may be selected from doped nanoparticles, seeded nanoparticles, core/shell or multi-shell structures, and others.

Generally, the PIN is of a size (diameter or longest axis) of between 1 to 1,000 nm, or any size therebetween. In some embodiments, the size is between 1 to 900 nm, between 1 to 800 nm, between 1 to 700 nm, between 1 to 600 nm, between 1 to 500 nm, between 1 to 400 nm, between 1 to 300 nm, between 1 to 200 nm, between 1 to 100 nm, between 1 to 90 nm, between 1 to 80 nm, between 1 to 70 nm, between 1 to 60 nm, between 1 to 50 nm, between 10 to 1,000 nm, between 20 to 1,000 nm, between 30 to 1,000 nm, between 40 to 1,000 nm, between 50 to 1,000 nm, between 60 to 1,000 nm, between 70 to 1,000 nm, between 80 to 1,000 nm, between 90 to 1,000 nm, between 100 to 1,000 nm, between 150 to 1,000 nm, between 200 to 1,000 nm, between 250 to 1,000 nm, between 300 to 1,000 nm, between 350 to 1,000 nm, between 400 to 1,000 nm, between 450 to 1,000 nm, between 500 to 1,000 nm, between 550 to 1,000 nm, between 600 to 1,000 nm, between 650 to 1,000 nm, between 700 to 1,000 nm, between 750 to 1,000 nm, between 800 to 1,000 nm, between 850 to 1,000 nm or between 900 to 1,000 nm. In some embodiments, the nanoparticles are between 1 to 500 nm in size.

The PINs used in accordance with the invention and any embodiment thereof, as herein defined, are selected of a material that is capable of acting as a "photoinitiator", namely a material that is capable of initiating photo-polymerization processes by forming reactive species or free radicals (in the form of an atom or group of atoms that have one or more unpaired electrons) upon light exposure. These processes may be any printing technology involving light activated polymerization reactions, such as two-photon absorption printing processes, and other light initiated 2D, or 3D and other printing and coatings processes.

When radicals are derived from oxygen atoms, they are referred to as reactive oxygen species (ROS). The ROS species may be in the form of singlet oxygen, superoxide anion, peroxide, hydroxyl radical, or others.

The nanoparticles are configured for use, as detailed herein, in methods such as photopolymerization processes, photodynamic therapy, in processes where antibacterial activity is to be induced or generated, in diagnostic methods, such as those involving ROS formation, water purification method and waste consumption or degradation methods.

The reactive species may be formed by light irradiating a formulation, suspension or dispersion comprising the PINs and at least one material capable of radical formation, capable of accepting at least one unpaired charge from the nanoparticle, or from any other reactive species that forms, or which dissociates in the presence of the PINs and upon light irradiation into a reactive species. The at least one material may be selected amongst any atom, molecule, ion and compound, such as water, hydroxide, oxygen, peroxides, azo compounds, disulphides, persulfates, carbon dioxide, carbonate, amines, azide, ammonia, hydroxylamine, nitrogen dioxide, nitrogen trioxide (e.g. nitrate and nitric acid), phosphite, phosphate, sulfur dioxide, sulphite, sulfate, peroxomonosulfate, selenite, thiols, sulphides, dithiocyanate, dihalogen, chlorine and bromine dioxide, acrylates (e.g. methyl acrylate), metharcrylates (e.g. methyl methacrylate), styrene, ethers, alcohols (e.g. methanol, ethanol and benzyl alcohol), epoxide, cyanate, isocyanate, urethane, lactams, olefins (e.g. ethylene, propylene and vinyl chloride), compounds or molecules which possess at least one such group, and others.

In some embodiments, the PINs are heterostructure semiconductor nanocrystals. These heterostructures are constructed of sections, each comprising different semiconductor material(s).

Generally speaking, the PINs may be formed of a material or a combination of materials or different phases of the same material, selected from Group II-VI semiconductors, Group III-V semiconductors, Group IV-VI semiconductors, Group IV elemental semiconductors, Group IV compound semiconductors, Group III-VI semiconductors, Group I-VI semiconductors, I-VII semiconductors, IV-VI semiconductors, V-VI semiconductors, II-V semiconductors, I-III-VI$_2$ semiconductors, oxides, ternary semiconductors, quaternary semiconductors, and alloys of any of the above.

In some embodiments, the semiconductor material is a Group I-VII semiconductor, optionally selected from CuF, CuCl, CuBr, CuI, AgF, AgCl, AgBr, AgI and the like.

In some embodiments, the semiconductor material is selected from (metal ion)$_x$(inorganic ion)$_y$. In some embodiments, the semiconductor material is selected from Cu$_x$(inorganic ion)$_y$, or Ag$_x$(inorganic ion)$_y$, or Cu$_x$(organic ion)$_y$, or Ag$_x$(organic ion)$_y$. In some embodiments, the semiconductor material is selected from Cu$_x$(chalcogenide)$_y$, or Ag$_x$(chalcogenide)$_y$, or Zn$_x$(chalcogenide)$_y$. In some embodiments, x and y are independently selected to have a value from 0.01 to 10. In further embodiments, x and y are independently selected to have a value from 0.01 to 5. In further embodiments, x and y are independently selected to have a value from 0.1 to 5. In further embodiments, x and y are independently selected to have a value from 0.1 to 3. In further embodiments, x and y are independently selected to have a value from 0.1 to 2.

In further embodiments, the PINs are of a material selected from copper sulfides; in some embodiments, the material is selected in a non-limiting manner from Cu$_2$S, Cu$_2$Se, CuInS$_2$, CuInSe$_2$, Cu$_2$(ZnSn)S$_4$, Cu$_2$(InGa)S$_4$, CuInS$_2$, CuGaS$_2$, CuAlS$_2$ and mixed copper-iron sulfides such as CusFeS$_4$ (Bornite) and CuFeS$_2$ (chalcopyrite). In further embodiments, the material is selected from copper selenides; in some embodiments, the material is selected in a non-limiting manner from Cu$_2$Se, CuInSe$_2$, CuInSe$_2$, Cu$_2$(ZnSn)Se$_4$, Cu$_2$(InGa)Se$_4$, CuInSe$_2$, CuGaSe$_2$, CuAlSe$_2$ and mixed copper-iron selenides such as CusFeSe$_4$ and CuFeSe$_2$.

In further embodiments, the material is selected from copper tellurides; in some embodiments, the material is selected in a non-limiting manner from Cu$_{0.75}$Te, CuInTe$_2$, CuInTe$_2$, Cu$_2$(ZnSn)Te$_4$, Cu$_2$(InGa)Te$_4$, CuInTe$_2$, CuGaTe$_2$, CuAlTe$_2$ and mixed copper-iron tellurides such as CusFeTe$_4$ and CuFeTe$_2$.

In further embodiments, the material is selected from silver sulfides; in some embodiments, the material is selected in a non-limiting manner from Ag$_2$S, Ag$_2$Se, AgInS$_2$, AgInSe$_2$, Ag$_2$(ZnSn)S$_4$, Ag$_2$(InGa)S$_4$, AgInS$_2$, AgGaS$_2$, AgAlS$_2$ and mixed silver-iron sulfides such as AgsFeS$_4$ and AgFeS$_2$.

In further embodiments, the material is selected from silver selenides; in some embodiments, the material is selected in a non-limiting manner from Ag$_2$Se, AgInSe$_2$, AgInSe$_2$, Ag$_2$(ZnSn)Se$_4$, Ag$_2$(InGa)Se$_4$, AgInSe$_2$, AgGaSe$_2$, AgAlSe$_2$ and mixed silver-iron selenides such as AgsFeSe$_4$ and AgFeSe$_2$.

In further embodiments, the material is selected from silver tellurides; in some embodiments, the material is selected in a non-limiting manner from Ag$_2$Te, AgInTe$_2$, AgInTe$_2$, Ag$_2$(ZnSn)Te$_4$, Ag$_2$(InGa)Te$_4$, AgInTe$_2$, AgGaTe$_2$, AgAlTe$_2$ and mixed silver-iron selenides such as AgFeTe$_4$ and AgFeTe$_2$.

In some embodiments, the material is a ternary material such as CuInS, CuInSe, CuInTe, AgInS, AgInSe or AgInTe, SbSI, SbSBr, SbSeI, SbSeBr, SbTeI, BiSCl, BiSBr, BiSeCl, BiSeBr, BiSeI. In some embodiments, the material is a quaternary material such as CuInGaS, CuInGaSe, CuInGaTe, CuInS$_2$, CuInSe$_2$, CuInTe$_2$, CuGaS$_2$, CuGaSe$_2$, CuAlSe$_2$, CuGaTe$_2$, CuAlTe$_2$, AgInGaS, AgInGaSe, AgInGaTe, AgInS$_2$, AgInSe$_2$, AgInTe$_2$, AgGaS$_2$, AgGaSe$_2$, AgAlSe$_2$, AgGaTe$_2$ or AgAlTe$_2$.

In some embodiments, the material is or comprises CdSe/CdS or CdSe/ZnS In some embodiments, the PINs comprise an alloy of a semiconductor material or core/shell structures made therefrom. In some embodiments, the material is or comprises a Group II-VI semiconductor, such as CdO, CdSe, CdS, CdTe, ZnSe, ZnS, ZnTe, ZnO, HgO, HgS, HgSe, HgTe, BeO, BeS, BeSe, BeTe, MgO, MgS, MgSe, MgTe and alloys thereof, e.g., CdZnSe, combinations thereof and core/shell layered-structures thereof.

In some embodiments, the material is or comprises a Group III-V semiconductor such as InAs, InP, GaAs, GaP, InN, GaN, InSb, GaSb, AlP, AlAs, AlSb, BP, BaS, BSb, and alloys thereof, e.g., InAsP, CdSeTe, ZnCdSe, InGaAs and the like.

In other embodiments, the material is or comprises a Group IV-VI semiconductor which may be selected from PbSe, PbTe, PbS, GeS, GeSe, SnS, SnSe, GeTe, SnTe, PbO and alloys thereof; and Group IV semiconductors that may be selected from Si and Ge and alloys thereof.

In some embodiments, the PINs are semiconductor-metal hybrid nanocrystals, comprising at least one metal/metal alloy region and at least one semiconductor region. The hybrid nanoparticles may be of any shape and size and may comprise any number of metal/metal alloy regions and any number of semiconductor regions. In some embodiments, the hybrid nanoparticles are of single tipped, dumbbell, body decorated or core/shell structure.

In some embodiments, the nanoparticles comprise at least one or at least two metal/metal alloy regions, separated by at least one semiconductor region, wherein each of said metal/metal alloy regions is of a different or same metal/metal alloy material. The different metal/metal alloy regions and different semiconductor regions may be of the same or different materials (same or different metals or metal alloys; same or different semiconductor materials), as selected herein.

The hybrid nanoparticle population (being formed of a plurality of one or more nanoparticle of the same or different shape and/or material) may comprise a blend of nanoparticles tuned to match specific or broad range optical properties of a material. Such blending of the nanoparticle population permits tuning of the energy levels and thus the redox potential of the nanostructures. In some embodiments, the hybrid nanoparticles have at least one elongated structure element comprising a first material, bearing on at least one end portion thereof a second material selected from metal and metal alloy. The first and second materials differ in their electrical conductivity and/or chemical reactivity and/or composition. In some embodiments, the elongated structure element comprises of semiconductor material(s).

In some embodiments, the hybrid nanoparticles are selected among seeded elongated elements (e.g., seeded rod), bearing on at least one end portion thereof a material selected from metal and metal alloy. In some embodiments, the seeded elongated elements comprise at least one semiconductor material.

The hybrid nanoparticles constructed as defined and exemplified herein may be made of any metal, metal alloy or semiconductor solid substance. The first material is selected from semiconductor materials, insulating materials, metals and mixtures thereof. In some embodiments, the first material is a semiconductor material of any of the above semiconductors; or as combinations of the semiconductors in composite structures and core/shell structures. In some embodiments, the hybrid nanoparticles are selected to comprise non-toxic semiconductor materials, such as ZnO. In some embodiments, the ZnO nanoparticles are decorated with multiple metal islands, ZnSe—Au nano-frames, and others.

The first material, being, in some embodiments a semiconductor, is different than the second material in at least one property selected from electrical conductivity, chemical reactivity and composition. Thus, in cases where the first material is a semiconductor material, the second material may be a metal, metal alloy, or an insulating material.

In some embodiments, the second material is at least one metal or a metal alloy. Examples of metals include transition metals such as Cu, Ag, Au, Pt, Co, Pd, Ni, Ru, Rh, Mn, Cr, Fe, Ti and alloys of such metals.

The hybrid nanoparticles may be of any shape. For certain applications, hybrid nanoparticles having elongated shape, for example rods, wires, or tubes are better suited, for example due to improved electron-hole separation. For other applications, branched forms may be better suited.

In some embodiments, the PINs are semiconductor nanocrystals selected to exhibit tunable high absorption extinction coefficients in the UV-blue region, which can also be tailored to cover the visible range via proper composition and size tuning. For example, CdSe/CdS rods as demonstrated herein have a high absorption extinction coefficient value, epsilon, of $10^5$-$10^8$ $M^{-1}$ $cm^{-1}$ in the UV and VIS range. High performance photo-polymerization with light excitation in the near UV-visible range of 300-700 nm, in some embodiments in the range of 385-450 nm is therefore also possible.

In some embodiments, a nanoparticle of the invention acting as a photoinitiator (PIN) may be used in food packaging.

Thus, for purposes herein, in some embodiments, a nanoparticle of the invention acting as a photoinitiator (PIN) may be used in combination with at least one material, as defined.

As used herein, where the PINs used in accordance with the invention are said to be surface-associated with inorganic ligands, unless otherwise indicated, they are not further associated with organic ligands. In other words, nanoparticles associated with inorganic ligands are associated with ligands consisting inorganic ligands. In a similar fashion, where the PINs used in accordance with the invention are said to be surface-associated with organic ligands, unless otherwise indicated, they are not further associated with inorganic ligands. In other words, nanoparticles associated with organic ligands are associated with ligands consisting organic ligands. In some embodiments, however, the nanoparticles may be surface-associated with a mixture or combination of inorganic and organic ligands, of any ratio.

Any nanoparticle utilized as disclosed herein may be associated with a plurality of inorganic ligands, wherein the ligands confer desired properties to the nanoparticle. The design and selection of ligand molecules can have crucial effects on a variety of functions and attributes and can be used to render stable and more effective or selective processes involving generation of reactive species. The inorganic ligands which surface-associate to the nanoparticles may be inorganic ions and complexes derived from one or more anions of P, Cd, Zn, Sn, S, As, Tl, Sb, Se, Te, I, Cl, N, In and others. Such anions may be selected from $As_3^{3-}$, $As_4^{2-}$, $As_5^{3-}$, $As_7^{3-}$, $As_{11}^{3-}$, $AsS_3^{3-}$, $As_2^-Se_6^{3-}$, $As_2^-Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $Cd(OH)_4^{2-}$, $GaTe^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $PO_3^{3-}$, $PO_4^{3-}$, $POCl_3$, $P_2O_7^{4-}$, $P_3O_{10}^{5-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^{-}$, $Sb_2Te_5^{4-}$, $Sb_2Te_7^{4-}$, $Sb_4Te_4^{4-}$, $Sb_9Te_6^{3-}$, $SbS_4^{3-}$, $Se_2^{2-}$, $Se_3^{2-}$, $Se_4^{2-}$, $Se_{5,6}^{2-}$, $Se_6^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $SnS_2S_6^{4-}$, $Sn_2Se_6^{4-}$, $Sn_2Te_6^{4-}$, $Sn_2Bi_2^{2-}$, $Sn_8Sb^{3-}$, $SnO_3^-$, $SnO_3^{2-}$, $SnO_4^{4-}$, $Te_2^{2-}$, $Te_3^{2-}$, $Te_4^{2-}$, $T_{12}Te_2^{2-}$, $TlSn_8^{3-}$, $TlSn_8^{5-}$, $TlSn_9^{3-}$, $TlTe_2^{2-}$, $SnS_4Mn_2^{5-}$, $ZnCl_4^{2-}$, $Zn(OH)_4^{2-}$, $Zn(NO_3)_4^{2-}$, $OH^-$, $S^{2-}$, $HS^-$, $Se^{2-}$, $HSe^-$, $Te^{2-}$, $HTe^-$, $TeS_3^{2-}$, $NH_2^-$, $F^-$, $Br^-$, $I^-$, $Cl^-$ and $N_3^-$, thiostannates (e.g. $SnS_4^{4-}$, $Sn_2S_6^{4-}$ and $Sn_2S_7^{6-}$), thiomolybdates (e.g. $MoS_4^{2-}$), thiotungstates (e.g. $WS_4^{2-}$), thiovanadates (e.g. $VS_4^{3-}$), $ReS_4^-$, molybdates (e.g. $MoO_4^{2-}$), tungstates (e.g. $WO_4^{2-}$), vanadates (e.g. $VO_4^{3-}$), $OsO_4$ and other inorganic complexes.

Thus, the invention contemplates a novel photoinitiator in the form of a nanoparticle surface-associated with a plurality of inorganic ligands.

In some embodiments, the PIN is a semiconductor homostructure surface-associated with a plurality of inorganic ligands.

In some embodiments, the PIN is a semiconductor heterostructure surface-associated with a plurality of inorganic ligands. In some embodiments, the PIN is a Type-1 semiconductor heterostructure surface associated with inorganic ligands. In some other embodiments, the PIN is a Type-2 semiconductor heterostructure surface associated with inorganic ligands. In some further embodiments, the PIN is a quasi-Type-2 semiconductor heterostructure surface associated with inorganic ligands. In some further embodiments, the PIN is a semiconductor-metal hybrid nanoparticles having a surface associated with inorganic ligands. Any of the above nanoparticles being capable of acting as a photoinitiator.

Where the PINs are Type-1 nanoparticles, the ligand molecules present on their surface may be selected from organic ligands and inorganic ligands. The inorganic ligands are as defined herein. The organic ligands are those known in the art, and may be monodentate or polydentate. The ligands may be selected amongst phosphines, phosphine oxides, phosphonic acids, amines, thiols, sulphides, carboxylic acids, mercapto carboxylic acids, thiocarabamtes, dithiocrabamates, xanthates, thioxanthates and others. Non-limiting examples of such organic ligands include, among others, trioctylphosphine oxide (TOPO), trioctylphosphine (TOP), tributylphosphine (TBP), dodecyl-phosphonic acid (DDPA), tridecylphosphonic acid (TDPA), octadecylphosphonic acid (ODPA), hexylphosphonic acid (HPA), dedecyl amine (DDA), tetradecyl amine (TDA), hexadecyl amine (HDA), octadecyl amine (ODA), oleylamine, hexadecane thiol, hexane thiol, mercapto propionic acid, mercapto undecanoic acid, glutathione (GSH), polyethylenimine (PEI), phenyldithiocarbamate, diethyldithiocarabamte, and combinations thereof. Other ligands may also be used. The ligands may be used as commercially available or synthetically prepared according to processes available in the art, for example as described in U.S. Pat. No. 7,160,613, International Application No. WO2009035657, International Application No. WO2010014198, and others. Any one of the above published applications, or any one of more of its corresponding US application(s), is herein incorporated by reference.

The invention further provides a formulation comprising PINs, as defined herein and optionally at least one material capable of undergoing photo-catalytic transformation. The material which is capable of being photo-catalytically transformed better photopolymerizable may be the material susceptible to radical formation or a material interacting with the reactive species formed.

The invention further provides a method for single- and two-photon-polymerization comprising irradiating a medium comprising PINs according to the invention and at least one material susceptible to photocatalytic conversion.

The invention further provides PINs for solvent-free polymerization. The invention further provides PINs for solvent-free polymerization and additive-free polymerization. The invention further provides PINs for solvent-free polymerization and amine-additive-free polymerization.

The invention further provides a method for printing and coating processes that include irradiating a solution comprising PINs of the invention in combination with ink components capable of undergoing polymerization. In some embodiments, the nanoparticles are utilized as photoinitiators for high-performance photo-polymerization in rapid 2D- or 3D-printing, which requires efficient generation of free radicals, following irradiation in the near UV-visible region, to induce photo-polymerization processes.

The invention further provides a method for surface photocuring, the method comprising irradiating a medium comprising PINs and at least one material susceptible to photocatalytic conversion (upon light irradiation by visible and/or near IR range and/or UV range light).

The invention further provides a method for photocuring in general, the method comprising irradiating a medium comprising PINS and at least one material susceptible to photocatalytic conversion (upon light irradiation by visible and/or near IR range and/or UV range light).

The nanoparticles population (being formed of a plurality of one or more types of nanoparticles of the same or different shape and/or materials) may comprise a blend nanoparticles, e.g., semiconductor nanocrystals, tuned to specific or broad range optical properties of the material. The blending of the nanoparticle populations permits tuning of the energy levels and thus the redox potential of the nanostructures.

In some embodiments, the photo-initiation step can take place in the presence of at least one type of enhancer or combination of different enhancers that can increase the photo-polymerization efficiency.

In some embodiments, the enhancers are capable of extracting at least one charge carrier, electron or hole, from the nanoparticle, e.g., heterostructure SCNC and catalysing a chemical reaction. Non limiting examples of such enhancers include inorganic complexes, such as nickel(II) nitrate, complexes of Fe(II) and 2,2'-bipyridine-4-ylcarbamodithioate and organic molecules, such as methylene blue, methyl viologen, polyethylenimine, trifluoroacetic acid and phenothiazine.

In some embodiments, the enhancer is selected to decompose a light-induced hydrogen peroxide that may be transformed in the process to hydroxyl radicals. One non-limiting example for such enhancers are complexes involved in Fenton reaction transforming hydrogen peroxide to hydroxyl radical and a hydroxide ion for example.

In some embodiments, the enhancer is selected to interact with at least one of the radicals to form more or other reactive species. Such enhancer may for example be a superoxide-dismutase (SOD) enzyme that converts superoxide to hydrogen peroxide, which subsequently decompose to hydroxyl radicals.

By an additional aspect of the invention, the invention provides a photocurable ink and coating compositions comprising a plurality of nanoparticles, as defined, e.g., heterostructure semiconductor nanoparticles and at least one polymerizable material in the form of at least one monomer, and/or at least one oligomer, and/or at least one pre-polymer or any combination thereof. In some embodiments, the plurality of nanoparticles is present in a catalytic amount.

The polymerizable materials, such as monomers, oligomers and pre-polymers, utilized in any polymerization reaction, e.g., in 2D or 3D UV cured printing processes, may be selected from any such materials that can undergo a photo-polymerization reaction. In some embodiments, the polymerizable materials may be selected from acrylic monomers, amine containing monomers, crosslinking acrylic monomers, modified gelatin acrylates, modified water-soluble/water-dispersible urethane oligomers and monomers, modified water-soluble/water-dispersible acrylates, dual reactive acrylic monomers, epoxides/anhydrides/imides, fluorescent acrylic monomers, fluorinated acrylic monomers, high or low refractive index monomers, hydroxy containing monomers, mono, di and multi-functional glycol oligomeric monomers, styrenic monomers, acrylamide monomers, vinyl and ethenyl monomers, and corresponding oligomers and pre-polymers.

In some embodiments, the ink and coating compositions optionally further comprises at least one additive selected from solvents, dispersants, reactive diluents, humectants, surfactants, rheological agents, ionic materials, organic solvents, dyes, pigments, stabilizers, polymers, accelerators, inhibitors, enzymes, electron and/or hole acceptor and wetting agents.

The photocurable ink may be formulated in any liquid media, selected from organic solvents, water and aqueous solutions or mixtures thereof, or "solvent free" with only monomers and/or oligomers as the liquid media, making them suitable for a variety of applications e.g., for food packaging, biomedical application such as 2D and 3D printing and with biomolecules, nutrients or live cells, within any photopolymerizable liquids. Such control is uniquely available for the nano-photoinitiators of the invention, where their liquid media compatibility can be modified by suitable surface chemistry modifications.

The present invention further concerns a method for providing dispersion of PINs, e.g., heterostructure semiconductor nanoparticles for use in the preparation of photocurable inks and 2D or 3D printing inks, the method comprising dispersing in a liquid medium a plurality of said PINs, said medium comprising one or more of the ink components as recited herein. In some embodiments, the dispersion are aqueous or "solvent free" dispersions comprising at least one nanoparticle type and at least one material to be polymerized.

The present invention further concerns a powder for dispersion in water, said powder comprising PINs as defined herein. The powder or dispersion may optionally further comprise at least one additional additive such as at least one dispersant, electron and/or hole acceptor, enzyme, other type of enhancer mentioned above and more. Non-limiting examples include polymers (e.g. polyvinylpyrrolidone, polyvinyl alcohol, polyacrylic acid, polyethylene glycol (PEG), polyethyleneimine (PEI), poly styrene-co-maleic anhydride (PSMA)), peptides (e.g. glutathione), DNA and RNA molecules, thiolate ligands (e.g. mercaptoundecanoic acid (MUA), mercaptohexanoic acid (MHA), mercaptopropionic acid (MPA), mercaptosulfonic acid (MSA), dihydrolipoic acid (DHLA)), alcohols (e.g. ethanol and methanol), sulfides, triethanolamine, acids (e.g. pyruvate, ascorbate, lactate, succinate, EDTA), amino acids, carbohydrate (e.g. glucose, sucrose), ubiquinol, NADH, NADPH, FAD, cations and/or anions and/or their salts, redox dyes, $C_{60}$, superoxide dismutase and cytochromes.

In solvent free compositions or uses, any of the above additives may be absent. Typically, in additive-free embodiments of the invention, the above recited additives are not included in a PIN containing composition or PIN-utilizing method.

In a powder form, the PINs may be present as solid nanoparticles or may be combined with at least one solid carrier such as a polymer or another solid in order to stabilize, protect or reduce the nanoparticles density in a powder volume. In some embodiments, the PINs are used in a particulate form. For example, a powder is prepared such that upon dispersion in water, a nanoparticles concentration of 0.8 µM, with particle sizes less than 100 nm is obtained.

The present invention further contemplates a polymerization process wherein a film of nanoparticles, as defined, is used as the photoinitiator entity.

The photo-polymerization ink can be used for a variety of applications.

In some embodiments, the ink or any composition or formulation of the invention may be used in a printing process, the process comprising patterning the ink/formulation on a substrate surface, the ink/formulation comprising a plurality of nanoparticles, e.g., heterostructure semiconductor nanoparticles and at least one polymerizable material, and irradiating said pattern to cause polymerization of said polymerizable material.

In some embodiments, the ink or any composition or formulation of the invention may be used in a coating process. In some embodiments, the ink or any composition or formulation of the invention may be used in food packaging.

The method may be for fabricating 2D patterns by any printing technology that makes use of photo-polymerization, such as stereolithography, digital processing printing, and inkjet printing followed by photo-polymerization.

In some embodiments, the invention can be used in fabrication of a 3D object, the method comprising deposition of a material, e.g., layer-by-layer, on a surface or on a previously layered or deposited layer, the material being in the form of a formulation or a composition comprising a plurality of PINs, e.g., heterostructure semiconductor nanoparticles, and at least one polymerizable material, and irradiating said pattern by one or two photon to cause polymerization of said material. Irradiation may be during or after each layer has been deposited, during or after several layers have been deposited or after the full object has been formed.

Methods of the invention permit construction of a variety of objects, not only by direct printing or by bottom-up methods. In some embodiments, the deposition is by printing, e.g., ink jet printing. In other embodiments, the deposition is by any other deposition technique known in the art.

The object thus formed may be of any size and shape and may be tailored based on the PINs utilized. In some embodiments, the object is in the form of a matrix such as a photocurable water-based matrix, e.g., hydrogels, suited for any application, such as scaffolds for medical implants, and biotechnological processes. For certain applications, the ink formulation may further comprise one or more functional materials intended to provide functionality to the printed polymeric structure. Among them, without limitations, are conductive materials or precursors for conductive materials (such as metallic nanoparticles and metal precursors, carbon nanotubes, graphene and their derivatives, conductive polymers), biological materials (such as cells and microorganisms, proteins and peptides, polysaccharides), special effect colorants (such as fluorescent, responsive materials) and sensing materials.

In some embodiments the PIN's are capable of functioning as photoinitiators for radical-polymerization but cannot be further used afterwards.

In some embodiments the PIN's are capable of functioning as photoinitiators for radical-polymerization and can be leached out from the formed polymer.

As the PINs, e.g., semiconductor nanoparticles are not consumed by the photo-polymerization reaction in some embodiments they may be initiated for further use by light irradiation. The PINs, e.g., semiconductor nanoparticles present in a printed or otherwise formed object according to methods of the invention may be activated after the object has been constructed to impose a variety of structural, mechanical, physical or chemical changes in the object. For example, the PINs may be in the form of a blend comprising multiple (two or more) different populations of nanoparticles, that can be activated by irradiation by different wavelengths, such that irradiation by one wavelength would cause polymerization of a single region of the object, while subsequent irradiation under light of a different wavelength would cause polymerization of another region of the object. This enables step-wise or on-demand polymerization.

Thus, the invention further provides a cured or partially cured pattern or object comprising a plurality of PINs distributed in the pattern or object material. In some embodiments, the pattern or object has been previously photocured, the photoinitiator being the PINs.

In other embodiments, the pattern or object has been previously photocured, the photoinitiator not being the nanoparticles. In some embodiments, the pattern or object has been previously cured with an initiator being different from a photoinitiator.

Therefore, the invention further contemplates a photocurable pattern or object comprising a plurality of PINs, e.g., semiconductor nanoparticles.

In some embodiments, the invention can be used in dental composites comprising photocurable materials or resins manipulated utilizing PINs, e.g., semiconductor nanoparticles, as disclosed herein.

The dental composition, comprising a plurality of PINs, as defined herein, at least one polymerizable resin, e.g., monomer, oligomer, pre-polymer, etc; and at least one filler, optionally an inorganic filler. Once the composition is positioned and shaped, it is irradiated to thereby activate the SCNC to cause polymerization of the at least one polymerizable resin. The composite may be used in vivo or ex vivo in the structuring of at least one dental article, such as crowns, bridges, denture teeth, inlays, on-lays, implant abutments, veneers, implants, implant accessories, implant posts, a filler or a dental mill blank.

As the PINs provide the opportunity for sequential photo-polymerization, the dental composite may be prepared ex vivo into a composite of certain toughness, by first exposing the composite to light of a first wavelength, and after its positioning in vivo expose the composite to light of a further wavelength to endow the composite with the required mechanical and physical properties.

The PINs are light-activated mixture comprising each at least one type of semiconductor based-nanoparticles having an absorption onset in the UV (200-400 nm), or the visible (400-700 nm) or the near infrared (NIR) range (0.7-3 µm). In some embodiments, the at least one semiconductor region has an absorption onset in the range of 350 nm to 3 µm. In some other embodiments, the at least one semiconductor region has an absorption onset in the range of 450 nm to 3 µm. In further embodiments, the at least one semiconductor region has an absorption onset in the range of 470 nm to 3

μm. In still other embodiments, the at least one semiconductor region has an absorption onset in the range of 500 nm to 3 μm.

In some embodiments, the PINs comprise at least one semiconductor component having an absorption onset in the UV (200-400 nm), in some embodiments above 350 nm, in some embodiments above 380 nm, or the visible (400-700 nm), in some embodiments above 420, or above 450 or above 500 nm) to near infrared (NIR) range (0.7-3 μm), said nanoparticle being capable of forming, upon irradiation (illumination) with a radiation in the visible and/or NIR range, an electron-hole and subsequently undergo extraction of at least one of the charge carriers.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 3A-C present an example of photopolymerization with heterostructures coated by organic ligands and "solvent free" formulations. FIG. 3A presents a polymerized object achieved by irradiation on formulation comprised of CdSe/CdS coated by organic ligands as photoinitiators, benzyl alcohol as the solvent and SR-9036A as the monomers. FIG. 3B demonstrates "solvent free" polymerization, showing FTIR measurement which follows the opening of the double bond of hydroxyethyl acrylate monomers during the excitation of CdSe/CdS seeded nanorods as the PINs.

FIG. 3C shows a "solvent free" high resolution printing of fluorescent gear with the CdSe/CdS as photoinitiators in a 2 photon polymerization printer.

FIGS. 4A-B show optical (FIG. 4A) and structural characterization (FIG. 4B, TEM) of the CdS/ZnS rod/shell nanorods heterostructure used as a model system in Example 2.

FIG. 6A shows comparison of hydroxyl radical formation by TPA assay during the excitation of CdS nanorods with PEI as organic surface coating or $S^{2-}$ as inorganic surface ligand coating. The figure shows enhanced photocatalytic activity for the latter. FIG. 6B is an image showing a gel that was formed following one minute light excitation of water based dispersion comprising of SR-9035 as monomers and CdS nanorods with inorganic surface ligand coating ($S^{2-}$) as photoinitiators. FIG. 6C provides an image showing a gel that was formed following one minute light excitation of "solvent free" formulation comprising hydroxyethyl acrylate and SR-9035 as monomers and cross linker, respectively and CdS nanorods with inorganic surface ligand coating ($S^{2-}$) as photoinitiators.

DETAILED DESCRIPTION OF EMBODIMENTS

The invention discloses high-performance photoinitiators in the form of nanoparticles, PINs, e.g., heterostructure SCNC, which may be used in a variety of applications ranging from biological and chemical technologies to industrial and environmental technologies.

EXAMPLES

Example 1: CdSe/CdS Seeded Rods Heterostructures Photoinitiator Dispersion and Example of Photoinitiator Activity CdSe/CdS seeded nanorods were synthesized by seeded growth approach yielding rods (FIG. 1). TEM images showed the resulting nanorods exhibit good size distribution, with average dimensions of 41±4 nm in length and 4.5±0.5 nm in diameter. The NRs were found to have an emission peak at 610 nm and fluorescence quantum yield of 47%±3% upon excitation at 405 nm. A ligand exchange procedure was applied, through coating by PEI (polyethyleneimine), to render the nanoparticles dispersible in water.

Figure 1A:
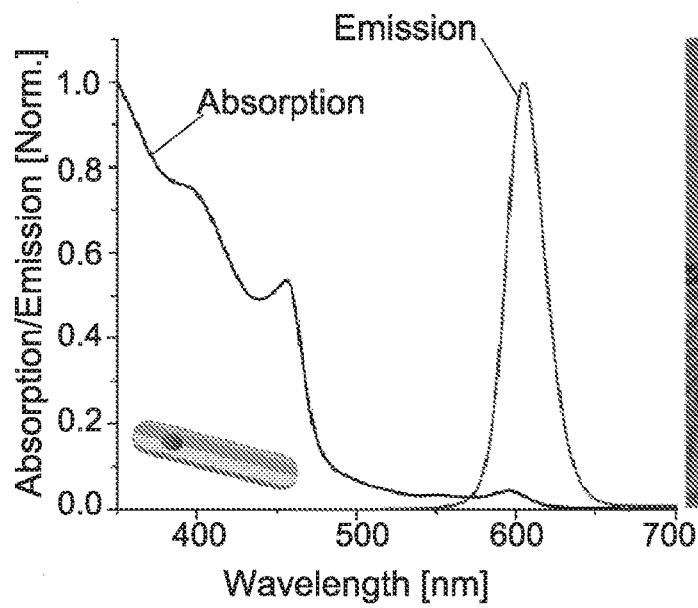
FIGS. 1A-B show optical (FIG. 1A) and structural characterization (FIG. 1B, TEM) of the CdSe/CdS seeded rod heterostructure used as model system in Example 1.
Figure 1B:
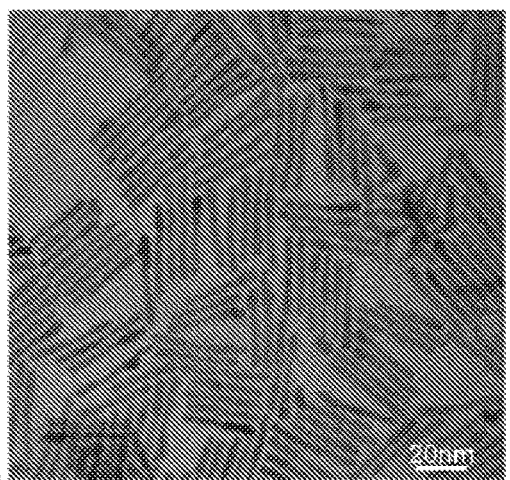

In FIG. 1A the absorption and emission spectra of CdSe/CdS seeded nanorods, respectively, are shown. The nanorods exhibit a sharp absorption rise at 480 nm, attributed to the CdS rod absorption onset, and an emission peak at 610 nm. The transmission electron micrograph (TEM) of CdSe/CdS nanorods with dimensions of 41±4 nm in length and 4.5±0.5 nm in diameter is shown in FIG. 1B.

Figure 2A:
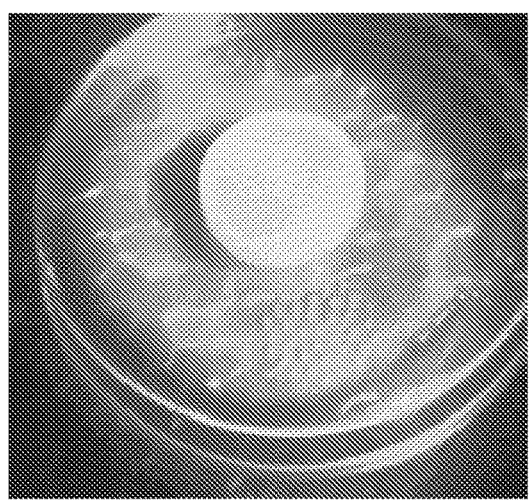
FIGS. 2A-B present gelation of SR9035 (FIG. 2B) and acrylamide (FIG. 2A) achieved after illumination of only tens of seconds on solution containing monomers and CdSe/CdS nanorods with organic surface coating in water. The CdS shell was synthesized by hot injection method. The heterostructure SCNC multi-functionality can be seen from the fluorescence of the post-polymerized structure emanating from these particles.
Figure 2B:
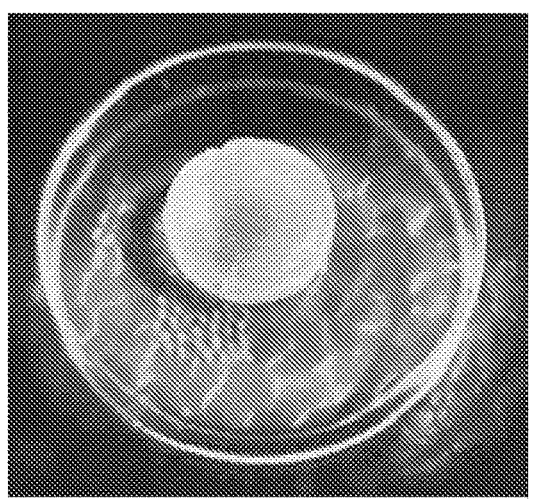

To determine the polymerization capacity of these nano-photoinitiator catalysts, two polymerization mediums comprising aqueous solutions of CdSe/CdS nanorods coated with PEI as photoinitiator were prepared. The first contained acrylamide monomers and 3% w/w SR-9035 as a crosslinker and the second contained only SR-9035 as the monomers. The solutions were irradiated with an LED at 405 nm. FIG. 2 shows the resulting two fluorescent discs under UV light. As shown in FIG. 2, light excitation of SCNC solution resulted in fast polymerization of the both SR9035 (FIG. 2B) and acrylamide monomers (FIG. 2A). This is a clear demonstration of efficient polymerization of monomer solution with heterostructure SCNCs as photoinitiators following tens of seconds of light excitation. The preservation of the SCNC fluorescence property also demonstrates the ability to use the heterostructure SCNC as multi-functional agents to both serve as photoinitiators in the polymerization stage, and then as emitting entities in the polymerized product.

The capacity to use the nanocrystals as photoinitiators also in solutions free of water, was further demonstrated with the CdSe/CdS nanocrystals. FIG. 3A shows gelation in a vial after light induced polymerization with hydrophobic CdSe/CdS seeded nanorods coated with the original ligands from the synthesis as the PINs, organic-based formulation comprising benzyl alcohol as the solvent and SR-9036a as the monomers. FIG. 3B further shows by FTIR measurement "solvent free" polymerization with CdSe/CdS seeded nanorods as the PINs and hydroxyethyl acrylate as monomers and liquid media. The curve shows almost full conversion of the acrylic monomers' double bond to a single bond due to photoinitiation by the excited nanoparticles.

FIG. 3C shows the capacity to use heterostructure nanocrystals for high resolution two photon printing. A fluorescent gear structure was printed in a Nanoscribe printer with 2-Hydroxyethyl acrylate as the monomers and liquid media and with CdSe/CdS nanorods as 2 photon photoinitiators and emitting particles.

Example 2: CdS/ZnS Rod/Shell Nanorods Photoinitiator Dispersion and Example of Photoinitiator Activity CdS nanorods were coated with ZnS shell for the synthesis of CdS/ZnS heterostructure by colloidal atomic layer deposition (C-ALD) synthesis. FIG. 4 presents the absorption spectrum of the nanorods and a TEM image of these nanoparticles.

Figure 5:
FIG. 5 presents gelation of SR9035 achieved after only 30 sec of illumination on solution containing monomers and CdS/ZnS nanorods with organic coating in water. The ZnS shell was synthesized by colloidal ALD.

The polymerization capability of the CdS/ZnS heterostructure nanorods was examined by irradiating an aqueous dispersion of CdS/ZnS nanorods coated with PEI and SR-9035 as the monomers using a 405 nm LED (FIG. 5). Excitation of an ink solution containing SR-9035 and CdS/ZnS heterostructure nanorods as PI resulted in fast gelation of the solution (30 sec). The shell growth was achieved by colloidal ALD approach.

Example 3: Polymerization with CdS Nanorods with Inorganic Ligands as Ns

Figure 6A:
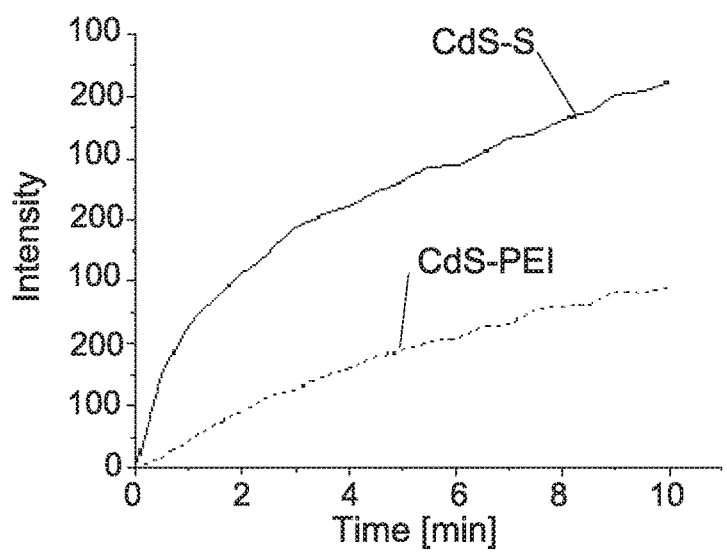
FIGS. 6A-C shows enhanced production of hydroxyl radicals by CdS nanorods coated with $S^{2-}$ as inorganic surface ligand coating in comparison to organic coating, and a demonstration of the capacity to use them as photoinitiators for radical polymerization.
Figure 6B:
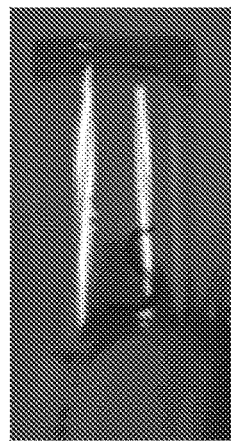
Figure 6C:
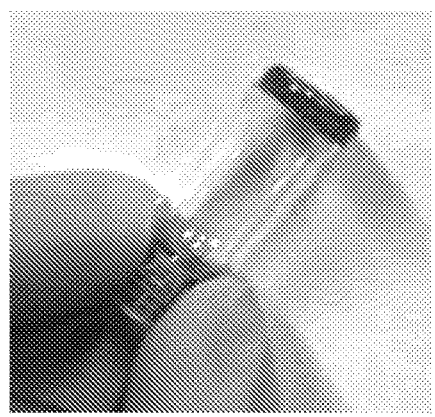

CdS nanorods were transferred to aqueous solutions by phase transfer with PEI as organic surface coating or by colloidal ALD treatment to replace the organic ligands from the synthesis step with $S^{2-}$ as inorganic surface ligand coating. The light-induced hydroxyl radical production by the two systems was compared by terephthalic acid (TPA) assay. This experiment showed significantly enhanced production of hydroxyl radicals by CdS nanorods with the inorganic coating (FIG. 6A). Then, a polymerization medium containing the CdS nanorods coated by $S^{2-}$ as inorganic ligands was irradiated with UV LED at 405 nm, and showed fast polymerization of the acrylic monomers in water (FIG. 6B) and in "solvent free" formulation (FIG. 6C).

Figure 7:
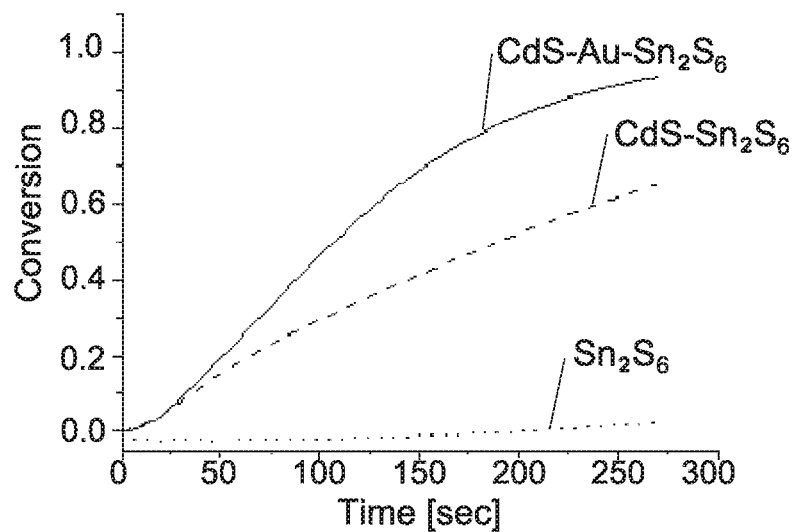
FIG. 7 demonstrates the capacity to use nanoparticles coated with $Sb_2S_6$ ligands as inorganic surface ligand coating as photoinitiators for radical polymerization. Kinetic FTIR measurements showed fast polymerization of "solvent free" formulation comprised of hydroxyethyl acrylate and two types of PINs: CdS nanorods or CdS—Au semiconductor-metal hybrid nanoparticles coated with $Sn_2S_6^{-4}$ as inorganic ligands. Control experiment with $Sn_2S_6^{-4}$ and hydroxyethyl acrylate didn't show photo-polymerization.
Figure 8A:
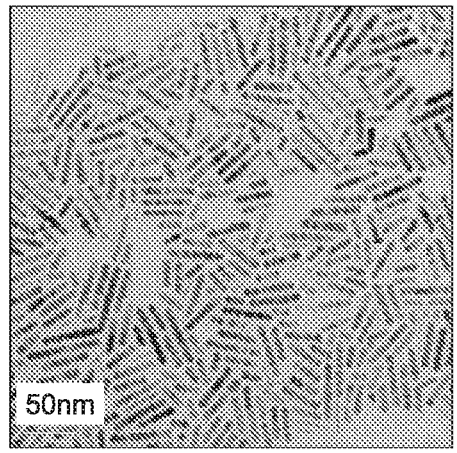
FIGS. 8A-B provide a TEM image (FIG. 8A) of Type-1 semiconductor heterostructures of ZnSe/ZnS with organic coating and FTIR data, demonstrating the capacity to use them as photoinitiators for radical polymerization. FTIR measurements (FIG. 8B) show high conversion degree of acrylic monomers during light excitation of ZnSe/ZnS PINs before and after exposure to oxygen.
Figure 8B:
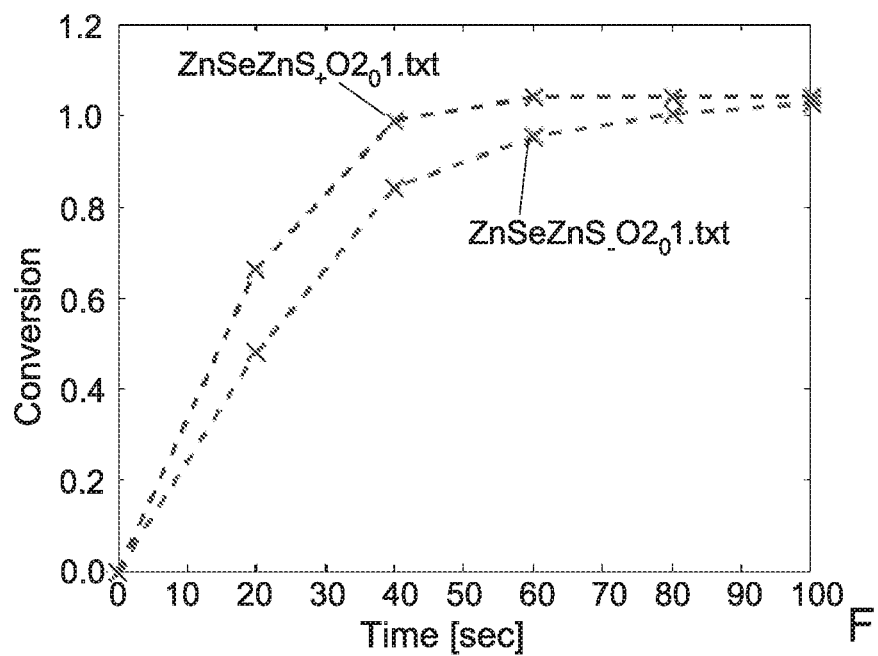

An example for polymerization by photoinitiators with additional inorganic ligands, such as $Sn_2S_6^-$ is presented in FIG. 7. CdS nanorods and CdS—Au hybrid nanoparticles coated by $Sn_2S_6^{-4}$ as inorganic ligands were used as PINS for the polymerization of "solvent free" formulation comprised of hydroxyethyl acrylate as the liquid medium and monomers. Rapid polymerization was observed by FTIR measurements during the irradiated of the sample with UV LED at 405 nm.

Example 4: ZnSe/ZnS Seeded Rods Heterostructures Photoinitiator Dispersion and Example of Photoinitiator Activity Type-1 semiconductor heterostructures of ZnSe/ZnS were transferred to water using PEI as surface coating. The photo-initiation capacity of these nanoparticles was examined by FTIR measurements and showed efficient polymerization water-based formulation comprising acrylamide as monomers and SR-9035 as a cross-linker.

EXPERIMENTAL DESCRIPTION

Synthesis of Semiconductor Nanoparticles:
Cadmium-chalcogenide based SCNC—as model systems—were synthesized by previously described protocols based on a seeded growth approach. Briefly, CdSe were synthesized by fast injection of selenium dissolved in trioctylphosphine (TOP) solution into a four necked flask containing cadmium oxide (CdO), trioctylphosphine oxide (TOPO) and n-octadecylphosphonic acid (ODPA) at 350° C. under argon atmosphere. CdS were synthesized by fast injection of sulfur dissolved in TOP solution into a four necked flask containing CdO, 1-octadecene (ODE) and oleic acid at 260° C. under argon atmosphere. Both reactions were quenched by removing the heating mantle and cooling with a fan. The crude reaction mixtures were precipitated with acetone followed by centrifugation. For further purification, the particles were dissolved in toluene and the precipitation procedure was repeated several times.

Shell growth on the CdSe and CdS seeds was then achieved as follows: the seeds were mixed with elemental sulfur dissolved in TOP and rapidly injected at 360° C. into a four neck flask containing TOPO, ODPA, CdO, and hexylphosphonic acid (HPA) for the synthesis of the CdSe/CdS and CdS nanorods (NRs). After cooling, the crude solution was dissolved in toluene, and methanol was added in order to precipitate the SCNC and remove excess of precursors and ligands.

Colloidal Atomic Layer Deposition (C-ALD):
As-synthesized CdS NRs with oleylamine ligands are dispersed in toluene and with methanol by centrifugation. The supernatant is discarded and the NRs are redispersed in hexane. Following another centrifugation the supernatant is taken aside and 40% $(NH_4)_2S$ aqueous solution in methylformamide (MFA) is added to the nanoparticles in hexane. The mixture is vortexed and the MFA layer is taken. The NRs in MFA are washed with hexane and precipitated using 1:1:1 MFA:acetonitrile:toluene and centrifugation.

Formation of a second half layer of cations (e.g. Zn), salt with a weak nucleophile anion (e.g. Nitrate) in MFA solution is added to the NR solution. The mixture is vortexed and oleylamine in hexane is added to the solution and vortexed vigorously, until the nanoparticles are transferred into the hexane phase.

Nanoparticle Characterization:
Transmission Electron Microscopy (TEM) characterization was performed using a Tecnai T12 G2 Spirit and Tecnai F20 G2 TEMs. All size statistics are done with "Scion image" program on 200 particles. Absorption was measured with a JASCO V-570 UV-vis-near IR spectrophotometer. Extinction coefficient values of the NRs were calculated using a previously reported method.

Phase Transfer:
NPs were transferred with polyethylenimine (PEI) as a polymer coating. NPs solution (1 mL) was mixed with PEI (0.15 g; MW 25,000) in chloroform (1 mL) for 1 hour. Then the particles are precipitated and washed with cyclohexane (1:1 chloroform/cyclohexane), followed by centrifugation. TDW is added to the precipitate and residues of PEI are removed by centrifugation.

Ligand Exchange with Inorganic Ligands:

Nanorods are dissolved in hexane and mixed with solution of $Na_4Sn_2S_6$ in N-methylformamide (NMF). The biphasic solution is stirred for one hour. The upper layer is discarded, and the lower layer is washed with hexane. The nanorods in the NMF layer are precipitated with acetone and finally redispersed in the solvent of choice.

Preparation of UV Curable Ink Formulation:

UV curable inks were prepared by (1) mixing 5 gr of monomer solution 10 g of Acrylamide and 2.5 g PEGylated diacrylate 600 (SR610); (2) mixing 10 g of acrylamide monomers, 1 g ethoxylated trimethylolpropane triacrylate (SR9035) serving as cross-linker, and 5 g TDW; (3) dissolving SR9035 in TDW. The monomer solutions were then mixed with different SCNC concentrations, at a volume ratio of 1:1. (4) PINs were dispersed in benzyl alcohol and mixed with ethoxylated (30) bisphenol A dimethacrylate (SR9036A). Solvent free formulations were prepared by dispersing the PINs in (5) 2-hydroxyethyl acrylate and SR9035 or (6) 2-hydroxyethyl acrylate as is.

The invention claimed is:

1. A method for photopolymerization, the method comprising light irradiating a photoinitiator in a form of at least one nanoparticle, in presence of at least one material susceptible to photopolymerization, wherein the nanoparticle is:
   a semiconductor heterostructure coated with a plurality of inorganic and/or organic ligands on its surface; or
   a Type-1 semiconductor heterostructure coated with inorganic and/or organic ligands on its surface.

2. The method according to claim 1, wherein the medium is an organic solvent-free solution.

3. The method according to claim 1, wherein the nanoparticle is a Type-1 nanoparticle surface-associated with inorganic ligands.

4. The method according to claim 1, wherein the nanoparticle is a Type-1 semiconductor heterostructure coated with inorganic ligands on its surface, and wherein the medium is solvent free.

5. A photoinitiator in the form of at least one nanoparticle surface-coated with inorganic ligands, the at least one nanoparticle being selected from semiconductor homostructures, heterostructures, doped nanoparticles, Type-1 nanoparticles, reversed Type-1 nanoparticles, Type-2 nanoparticles, quasi Type-2 nanoparticles and of semiconductor-metal hybrid nanoparticles.

6. The photoinitiator according to claim 5, wherein the nanoparticle is a semiconductor heterostructure or a Type-1 semiconductor heterostructure.

7. The method according to claim 1, wherein the nanoparticle is selected from spherical, dot-shaped, rod-shaped, wire, cubic, cylindrical, whisker-like, platelet, multipod, frame, doped nanoparticles, seeded nanoparticles, core/shell or multi-shell nanoparticle structures, single tip nanoparticle structures, dumbbells or body decorated nanoparticle structures.

8. The method according to claim 1, wherein the nanoparticle is formed of a material or combination of materials selected from Group II-VI semiconductors, Group III-V semiconductors, Group IV-VI semiconductors, Group IV elemental or compound semiconductors, Group III-VI semiconductors, Group I-VI semiconductors, ternary semiconductors, I-VII semiconductors, V-VI semiconductors, II-V semiconductors, I-III-VI$_2$ semiconductors, oxides, quaternary semiconductors and alloys thereof.

9. The method according to claim 1, wherein the inorganic ligands are selected from one or more anions of P, S, As, Tl, Se, Te, I, Cl, Br, O, F and N.

10. The method according to claim 1, wherein the inorganic ligands are selected from $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $GaTe^{2-}$, $Ge_9^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $PO_3^{3-}$, $PO_4^{3-}$, $POCl_3$, $P_2O_7^{4-}$, $P_3O_{10}^{5-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^-$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $SnS_2S_6^{4-}$, $Sn_2Se_6^{4-}$, $Sn_2Te_6^{4-}$, $Sn_2Bi_2^{2-}$, $Sn_8Sb^{3-}$, $SnO_3^-$, $SnO_3^{2-}$, $SnO_4^{2-}$, $Te_2^{2-}$, $Te_3^{2-}$, $Te_4^{2-}$, $Tl_2Te_2^{2-}$, $TlSn_8^{3-}$, $TlSn_8^{5-}$, $TlSn_9^{3-}$, $TlTe_2^{2-}$, $SnS_4Mn_2^{5-}$, $ZnCl_4^{2-}$, $Zn(NO_3)_4^{2-}$, $S^{2-}$, $HS^-$, $Se^{2-}$, $HSe^-$, $Te^{2-}$, $HTe^-$, $TeS_3^{2-}$, $NH_2^-$, $I^-$, $Cl^-$ and $N_3^-$, $SnS_4^{4-}$, $Sn_2S_6^{4-}$, $Sn_2S_7^{6-}$) and $SbS_4^{3-}$.

11. The method according to claim 1, being a method for single- and two-photon-polymerization.

12. The method according to claim 1, being a method for 2D or 3D printing comprising irradiating a solution comprising at least one said nanoparticle in combination with at least one material capable of undergoing polymerization.

13. The method according to claim 1, being a method for surface photocuring, the method comprising irradiating a medium comprising at least one said nanoparticle and at least one material prone to photocatalytic conversion upon light irradiation by visible and/or near IR range and/or UV range light.

14. A method for photopolymerization, the method comprising light irradiating a photoinitiator in a form of at least one nanoparticle in the presence of at least one material susceptible to photopolymerization, wherein the nanoparticle is:
   a semiconductor nanoparticle coated with a plurality of inorganic ligands on its surface; or
   a semiconductor heterostructure coated with a plurality of inorganic and/or organic ligands on its surface; or
   a Type-1 semiconductor heterostructure coated with inorganic and/or organic ligands on its surface;
wherein the inorganic ligands are selected from $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $GaTe^{2-}$, $Ge_9^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $PO_3^{3-}$, $PO_4^{3-}$, $POCl_3$, $P_2O_7^{4-}$, $P_3O_{10}^{5-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^-$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $SnS_2S_6^{4-}$, $Sn_2Se_6^{4-}$, $Sn_2Te_6^{4-}$, $Sn_2Bi_2^{2-}$, $Sn_8Sb^{3-}$, $SnO_3^-$, $SnO_3^{2-}$, $SnO_4^{2-}$, $Te_2^{2-}$, $Te_3^{2-}$, $Te_4^{2-}$, $Tl_2Te_2^{2-}$, $TlSn_8^{3-}$, $TlSn_8^{5-}$, $TlSn_9^{3-}$, $TlTe_2^{2-}$, $SnS_4Mn_2^{5-}$, $ZnCl_4^{2-}$, $Zn(NO_3)_4^{2-}$, $S^{2-}$, $HS^-$, $Se^{2-}$, $HSe^-$, $Te^{2-}$, $HTe^-$, $TeS_3^{2-}$, $NH_2^-$, $I^-$, $Cl^-$ and $N_3^-$, $SnS_4^{4-}$, $Sn_2S_6^{4-}$, $Sn_2S_7^{6-}$) and $SbS_4^{3-}$.

* * * * *